United States Patent
Tanaka et al.

(10) Patent No.: US 8,059,834 B2
(45) Date of Patent: Nov. 15, 2011

(54) AUTOMATIC GAIN CONTROL CIRCUIT

(75) Inventors: Yasuomi Tanaka, Hamamatsu (JP); Nobuaki Tsuji, Hamamatsu (JP); Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1165 days.

(21) Appl. No.: 11/825,544

(22) Filed: Jul. 6, 2007

(65) Prior Publication Data
US 2008/0008336 A1 Jan. 10, 2008

(30) Foreign Application Priority Data

Jul. 7, 2006 (JP) ................................ 2006-188713
Jul. 7, 2006 (JP) ................................ 2006-188718

(51) Int. Cl.
*H03G 3/00* (2006.01)

(52) U.S. Cl. ........ 381/107; 381/104; 381/120; 330/254; 330/278

(58) Field of Classification Search .......... 381/104–109, 381/56, 111, 120; 330/254, 278
See application file for complete search history.

(56) References Cited

U.S. PATENT DOCUMENTS

| | | | | |
|---|---|---|---|---|
| 5,369,711 A | * | 11/1994 | Williamson, III | ............ 381/104 |
| 5,396,562 A | * | 3/1995 | Ishimitsu et al. | ............. 381/107 |
| 5,633,939 A | | 5/1997 | Kitani et al. | |
| 5,642,075 A | | 6/1997 | Bell | |
| 5,680,075 A | | 10/1997 | Sacca | |
| 6,201,873 B1 | * | 3/2001 | Dal Farra | ...................... 381/100 |
| 6,661,287 B2 | | 12/2003 | Lin et al. | |
| 7,039,376 B2 | * | 5/2006 | Isoda | ........................ 455/232.1 |
| 2002/0076072 A1 | * | 6/2002 | Cornelisse | .................... 381/312 |
| 2006/0013414 A1 | | 1/2006 | Shih | |

FOREIGN PATENT DOCUMENTS

| | | |
|---|---|---|
| JP | 1-143569 A | 6/1989 |
| JP | 04-287415 | 10/1992 |
| JP | 05-063481 | 3/1993 |
| JP | 5075367 | 3/1993 |
| JP | 8065200 | 3/1996 |
| JP | 08-321728 | 12/1996 |
| JP | 9-36683 A | 2/1997 |
| JP | 9093063 | 4/1997 |
| JP | 10-126182 | 5/1998 |

(Continued)

OTHER PUBLICATIONS

Korean Intellectual Property Office: Notice of Preliminary Rejection for Appln. No. 10-2007-0068303 for Applicant Yamaha Corp. (Dated: Sep. 29, 2008).

(Continued)

*Primary Examiner* — Devona Faulk
*Assistant Examiner* — Disler Paul
(74) *Attorney, Agent, or Firm* — Pillsbury Winthrop Shaw Pittman LLP

(57) ABSTRACT

A controller 100 updates data LVLm indicative of a level section of an input audio signal and controls a reference level Vr based on a signal CMP representative of a comparison result between the input audio signal and the reference level Vr, and further, controls gains of electronic volumes 10L and 10R in such a manner that these gains become such gains corresponding to the level section of the input audio signal. In this case, the level sections of the input audio signals are related to the gains in such a manner that levels of output signals of the electronic volumes do not exceed a previously set output amplitude upper limit level.

10 Claims, 9 Drawing Sheets

FOREIGN PATENT DOCUMENTS

| | | |
|---|---|---|
| JP | 2001-16680 A | 1/2001 |
| KR | 2002-0067796 A | 8/2002 |
| KR | 10-2005-0087172 | 8/2005 |
| TW | 518819 | 1/2003 |
| TW | 1240573 | 9/2005 |
| WO | WO 00/18007 | 3/2000 |

OTHER PUBLICATIONS

European Patent Office: Extended European Search Report for Application No. 07013392.1-1233, dated Dec. 19, 2007.

Japanese Patent Office: Notice of Reasons for Refusal for Application No. 2006-188713, dated Jul. 8, 2008.

Japanese Patent Office: Notice of Reasons for Refusal for Application No. 2006-188718, dated Jul. 8, 2008.

ROC (Taiwan) Patent Office "Office Action" dated Jul. 13, 2010, Patent Application No. 096124515, 4 pages.

Japanese Patent Office: Notification of Reasons for Refusal for Patent Application No. 2006-190991, dated Jul. 8, 2008.

* cited by examiner

FIG. 2

| PREDICTED VALUE OF Vp | LVLm | | | | | | |
|---|---|---|---|---|---|---|---|
| | MSB | | | | | | LSB |
| Vp>Vr(N-1) | 1 | 1 | 1 | -------- | 1 | 1 | 1 |
| Vp>Vr(N-2) | 0 | 1 | 1 | | 1 | 1 | 1 |
| ⋮ | | | | ⋮ | | | |
| Vp>Vr(2) | 0 | 0 | 0 | -------- | 0 | 1 | 1 |
| Vp>Vr(1) | 0 | 0 | 0 | -------- | 0 | 0 | 1 |
| Vp≤Vr(1) | 0 | 0 | 0 | -------- | 0 | 0 | 0 |

CMP=H ↑↓ CMP=L

FIG. 3

| PREDICTED VALUE OF Vp | LVLm | | | | | | | DLVL |
|---|---|---|---|---|---|---|---|---|
| | MSB | | | | | | LSB | |
| Vp>Vr(N-1) | 1 | 1 | 1 | -------- | 1 | 1 | 1 | DESIGNATE Vr(N-1) |
| Vp>Vr(N-2) | 0 | 1 | 1 | -------- | 1 | 1 | 1 | DESIGNATE Vr(N-1) |
| Vp>Vr(N-3) | 0 | 0 | 1 | -------- | 1 | 1 | 1 | DESIGNATE Vr(N-2) |
| ⋮ | | | | ⋮ | | | | ⋮ |
| Vp>Vr(2) | 0 | 0 | 0 | -------- | 0 | 1 | 1 | DESIGNATE Vr(3) |
| Vp>Vr(1) | 0 | 0 | 0 | -------- | 0 | 0 | 1 | DESIGNATE Vr(2) |
| Vp≤Vr(1) | 0 | 0 | 0 | -------- | 0 | 0 | 0 | DESIGNATE Vr(1) |

FIG. 4

| LVLs | | | | | | | DGAIN |
|---|---|---|---|---|---|---|---|
| MSB | | | | | | LSB | |
| 1 | 1 | 1 | -------- | 1 | 1 | 1 | DESIGNATE G(N) |
| 0 | 1 | 1 | -------- | 1 | 1 | 1 | DESIGNATE G(N-1) |
| 0 | 0 | 1 | -------- | 1 | 1 | 1 | DESIGNATE G(N-2) |
| | | | ⋮ | | | | ⋮ |
| 0 | 0 | 0 | -------- | 0 | 1 | 1 | DESIGNATE G(3) |
| 0 | 0 | 0 | -------- | 0 | 0 | 1 | DESIGNATE G(2) |
| 0 | 0 | 0 | -------- | 0 | 0 | 0 | DESIGNATE G(1) |

AUTOMATIC GAIN CONTROL CIRCUIT

BACKGROUND OF THE INVENTION

The present invention is related to an automatic gain control circuit suitably used to control a gain of an audio appliance.

In general, automatic gain control circuits (will be referred to as "AGC circuits" hereinafter) have been provided at a pre-stage of a power amplifier in output stage of an audio appliance such as speaker reproducing apparatus and recording apparatus. The above-described AGC circuit is a circuit equipped with a function capable of controlling a gain when input audio signals are amplified in order that even under such a condition that peak levels of waveforms of the input audio signals are varied, the input audio signals are amplified in proper levels and then the amplified input audio signals having the proper levels are supplied to a power amplifier. There are some possibilities that this sort of AGC circuits are employed as means for preventing occurrences of clips in power amplifiers employed in output stages of audio apparatuses. It should be understood that these AGC circuits are disclosed in, for instance, JP-A-9-93063, and JP-A-2000-106511. Further, the clip preventing technique using the AGC circuit is disclosed in JP-A-2000-106511.

On the other hand, the clip preventing techniques utilizing the conventional AGC circuits are described in, for example, JP-A-2000-106511 as the conventional technical idea. That is, in JP-A-2000-106511, temporal averaged values of output signal voltages of a power amplifier are detected; and a gain of an amplifier provided at a prestige of the power amplifier is fed back in a negative feedback control manner in such a manner that the detected averaged value becomes constant in order that peak levels of output signal waveforms of the power amplifier may be converged to such a level lower than, or equal to a clip level. Although such utilization modes of these AGC circuits have merits to prevent clips, there is such a problem that since non-linear elements such as VCA and the like are used, the output signals of the power amplifiers are distorted.

Further, in the AGC circuits, it is required to set an attack time and a release time to an appropriate length according to the application of the AGC circuits. The attack time is a time for lowering a gain of the amplifier in response to a level of the input audio signal when the level increases, and the release time is a time for increasing the gain of the amplifier in response to the level of the input audio signal when the level is decreased. In the related art, in the case that the AGC circuit is implemented by a semiconductor integrated circuit, a time constant circuit having a time constant in response to the attack time and the release time is externally provided to the AGC circuit which is the semiconductor integrated circuit so that the AGC circuit performs an operation for obtaining the attack time and the release time. Therefore, number of parts of the whole audio appliance including the AGC circuit increased, and thereby increasing the cost. Further, the time constant of the time constant circuit may be sensitive to the temperature and may change over time. Thus, if this circuit is used or the AGC circuit, the problem arises in which stabilities of the attack time and the release are poor.

SUMMARY OF THE INVENTION

The prevent invention has been made to solve the above-described problem of the conventional technical ideas, and therefore, has an object to provide an AGC circuit capable of controlling a gain with respect to an input audio signal without distorting an output signal of a power amplifier, and capable of preventing a clip by lowering the gain when there is a risk that the clip may be produced.

Another object of the present invention is to provide an automatic gain control circuit which can suitably set an attack time and a release time without employing an external time constant circuit.

The present invention is to provide an automatic gain control circuit comprising:

an electronic volume that amplifies an input audio signal in a variable gain and outputs the amplified input audio signal; and a gain controller that controls a gain of the electronic volume in response to a level of the input audio signal, and performs a control operation for lowering the gain of the electronic volume so that a level of an output signal of the electronic volume, which is determined based on both the level of the input audio signal and the gain of the electronic volume, does not exceed an output amplitude upper limit level.

In accordance with the present invention, as the means for controlling the gain, not such a non-linear element as VCA is employed, but the electronic volume is employed. As a result, the gain can be controlled without distorting the output signal of the power amplifier with respect to the input audio signal. In the case that the level of the output signal of the electronic volume exceeds the previously set output amplitude upper limit level, a control operation for lowering the gain of the electronic volume is carried out, so that the level of the output signal of the electronic volume is limited within the output amplitude upper limit level. As a consequence, if the output amplitude upper limit level is set to be coincident with an upper limit of an input level at which a clip is not produced in a power amplifier provided at a post stage of the electronic volume, then the gain is reduced where there is such a risk that the clip may occur. As a result, it is possible to prevent the clip in the power amplifier.

JP-A-2000-106511 discloses such a technical idea that when the occurrence of the clip in the output signal of the power amplifier is sensed, the AGC function is made active so as to reduce the gain when the input audio signal is amplified, and therefore, so as to avoid the clip. However, the inventive idea of the present invention is not related to such a technical idea as disclosed in JP-A-2000-106511 that the occurrence of the clip is sensed so as to lower the gain, but is related to the following technical idea: That is, while the output amplitude upper limit level at which the clip is not produced in the power amplifier provided in the post stage is previously set, when the level of the output signal of the electronic volume exceeds this output amplitude upper limit level, the gain of the electronic volume is lowered in order that the level of the output signal of the electronic volume does not exceed this output amplitude upper limit level, and thus, the occurrence of the clip is prevented. This technical idea is essentially different from that of the patent publication 2.

According to the present invention, an automatic gain control circuit comprises:

an electronic volume that amplifies an input audio signal in a variable gain and outputs the amplified input audio signal;

a reference level generator that outputs a reference level;

a level judging unit that compares a level of the input audio signal with the reference level outputted by the reference level generator and outputs a comparison result signal for indicating whether or not the level of the input audio signal is higher than the reference level; and a controller updates predicted level data indicative of a level section, to which the level of the input audio signal belongs, among a plurality of level sections based on the comparison result signal, controls the reference level outputted by the reference level generator based on the predicted level data, and controls the gain of the electronic volume based on the predicted level data so that the gain of the electronic volume becomes a gain which is previously related to the level section to which the level of the input audio signal belongs, wherein the level section and the gain of the input audio signal are related to each other in such a manner that a level of the output signal of the electronic volume does not exceed a previously set output amplitude upper limit level.

With this arrangement, the automatic gain control circuit is arranged in such a manner that the gain corresponding to the level section to which the level of the input audio signal belongs is set to the electronic volume. In addition, the level section and the gain of the input audio signal are related to each other in such a manner that the level of the output signal of the electronic volume does not exceed the previously set output amplitude upper limit level. As a consequence, the output amplitude upper limit level is set to a proper level by which the clip does not occur in the power amplifier of the post stage, so that it is possible to avoid the occurrence of the clip in the power amplifier of the post stage.

In this preferred mode, the corresponding relationship between the gain and the level section of the input audio signal is properly determined, not only the above-described clip preventing effect, but also other effects may be achieved. For instance, a gain corresponding to a level section equivalent to a large sound volume area is lowered. As a result, while a dynamic range may be suppressed, the unpleasant large sound volume may be reduced. Alternatively, a gain with respect to a level section equivalent to a small sound volume may be increased in order that small sound may be amplified in an easy listening sound volume.

According to the present invention, an automatic gain control circuit comprising:

an electronic volume that amplifies an input audio signal in a variable gain and outputs the amplified input audio signal:

a reference level generator that outputs a reference level;

a level judging unit that compares the input audio signal with the reference level outputted by the reference level generator, and outputs a comparison result signal for indicating whether a level of a peak of a waveform of the input audio signal is higher than the reference level;

a controller that performs a first, second, third and fourth controls according to predetermined respective clocks, wherein the first control increases the reference level outputted by the reference level generator when the comparison result signal indicates that the level of the peak of the waveform of the input audio signal is higher than the reference level, wherein the second control lowers the reference level outputted by the reference level generator when the comparison result signal indicates that the level of the peak of the waveform o the input audio signal is not higher than the reference level, wherein the third control lowers the gain of the electronic volume so as to approximating the increase of the reference level so that the gain of the electronic volume becomes a proper gain related to the reference level, and wherein the fourth control increases the gain of the electronic volume so as to follow the decrease of the reference level so that the gain of the electronic volume becomes a gain related to the reference level.

With this arrangement, the higher the time density when the first and third controls are performed, the attack time is shorten, and the higher the time density when the second and fourth controls are performed, the release time is shorten. Therefore, by setting appropriately the frequencies of respective values which are the triggers of the respective first to fourth controls, the desired attack time and release time can be obtained.

BRIEF DESCRIPTION OF THE DRAWINGS

FIG. 2 is a diagram for explaining an increasing/decreasing operation of predicted level data LVLm executed by a controller 100, and a content of the predicted level data LVLm in the first embodiment.

FIG. 3 is a diagram for indicating a conversion rule in the case that a decoder 40 converts the predicted level data LVLm into reference level designation data DLVL in the first embodiment.

FIG. 4 is a diagram for representing a conversion rule in the case that a decoder 50 converts gain setting level data LVLs into gain designation data DGAIN in the first embodiment.

DESCRIPTION OF PREFERRED EMBODIMENTS

Referring now to drawings, a description is made of embodiments of the present invention.

First Embodiment

Figure 1:
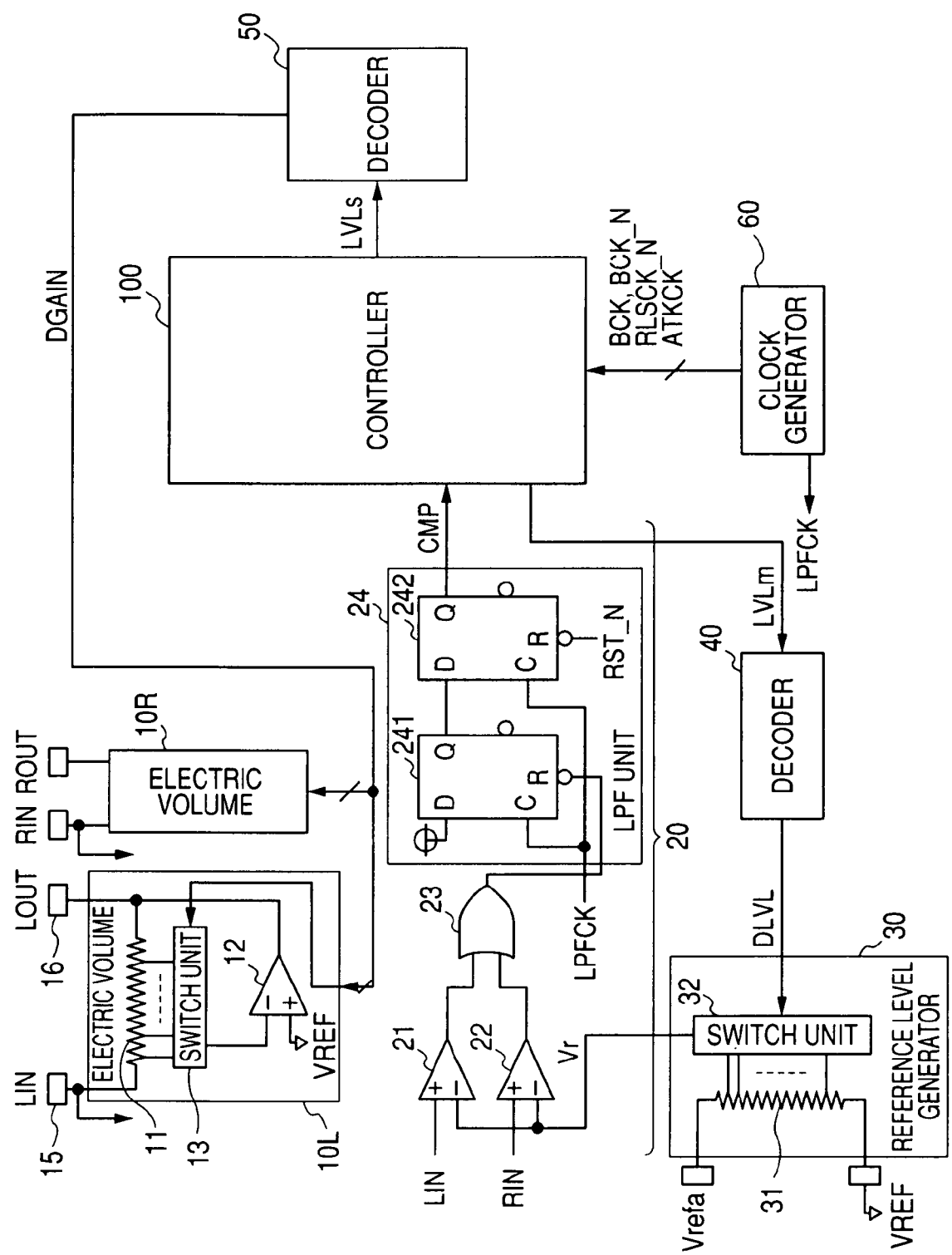
FIG. 1 is a block diagram for indicating an arrangement of an AGC circuit according to a first embodiment of the present invention.

FIG. 1 is a block diagram for indicating an arrangement of an AGC (automatic gain control) circuit according to a first embodiment of the present invention. The AGC circuit according to the first embodiment is a semiconductor integrated circuit in which electronic volumes 10L and 19R, a level judging unit 20, a reference level generator 30, decoders 40 and 50, a clock generator 60, and a controller 100 are formed on a semiconductor substrate. The AGC circuit is mounted on, for example, an audio appliance such as a speaker reproducing apparatus.

The electronic volumes 10L and 10R are circuits which amplify an L-channel input audio signal LIN and an R-channel input audio signal RIN based on gains designated by gain designation data DGAIN respectively, and output an audio signal LOUT and another audio signal ROUT. The gain designation data DGAIN are applied from the decoder 50 among "N" sorts of gains G(K) (K=1 to N), while a magnitude relationship is given as G(1)>G(2)>, - - - ,G(N). In such a case that this AGC circuit is mounted on, for example, a speaker reproducing apparatus, the audio signal LOUT and the audio signal ROUT outputted from the electronic volumes 10L and 10R are inputted to a power amplifier for driving a speaker.

A structural example of the electric volume 10L is shown in FIG. 1. It should be noted that the electronic volume 10R has a similar structure to that of the electronic volume 10L. In the structural example shown in FIG. 1, the electronic volume 10L is constituted by a resistor 11, an operational amplifier 12, and a switch unit 13. The resistor 11 is inserted between an audio signal input terminal 15 to which an input audio signal LIN is applied, and an audio signal output terminal 16 for outputting an audio signal LOUT. In the operational amplifier 12, a reference voltage VREF outputted from a reference voltage source (not shown) is applied to a non-inverting input terminal (+ terminal), and an output terminal is connected to an audio signal output terminal 16. The switch unit 13 is a circuit which selects one center tap from "N" pieces of center taps provided in the resistor 11, and connects the selected center tap to an inverting input terminal (− terminal) of the operational amplifier 12.

In this structural example, while the inverting input terminal of the operational amplifier 12 is virtually grounded, a gain of the electronic volume 10L is determined based on a ratio Rb/Ra. The resistance value "Ra" corresponds to a resistance value within the resistor 11 from the audio signal input terminal 15 up to the center tap which is connected to the inverting input terminal of the operational amplifier 12 by the switch unit 13. The resistance value Rb corresponds to a resistance value within the resistor 11 from this center tap up to the audio signal output terminal 16. Then, in this structural example, positions of N pieces of the center taps in the resistor 11 are determined in correspondence with all of gains G(K) (K=1 to N) which may be designated based on the gain designation data DGAIN. The switch unit 13 is arranged in such a manner that when gain designation data DGAIN for designating a certain gain G(K) is applied, a center tap corresponding to this designated gain G(K) is selected to be connected to the inverting input terminal of the operational amplifier 12. Since the gain of the electronic volume 10L is determined based on the resistance ratio Rb/Ra, this electronic volume 10L has a merit that the input audio signal LIN can be amplified without any distortion.

The level judging unit 20 is a circuit which compares the input audio signals LIN and RIN with a reference level Vr applied from the reference level generator 30, and when at least one of the input audio signals LIN and RIN exceeds the reference value Vr, a comparison result signal CMP having an H level is outputted, whereas when at least one of the input audio signals LIN and RIN does not exceed the reference value Vr, a comparison result signal CMP having an L level is outputted. The AGC circuit according to this first embodiment performs a control operation of the reference level Vr generated by the reference level generator 30 based on the comparison result signal CMP, and another control operation for changing the gains of the electronic volumes 10L and 10R in proper values. Modes of these control operations will be described later.

In the example shown in FIG. 1, the level judging unit 20 is arranged by a comparator 21, another comparator 22, an OR gate 23, and an LPF unit 24. The comparator 21 compares the input audio signal LIN with the reference level Vr. The comparator 22 compares the input audio signal RIN with the reference level Vr. The OR gate 23 OR-gates the output signals of the comparators 21 and 22 to output the OR-gated signal. The LPF unit 24 passes therethrough only signals having frequencies lower than, or equal to a predetermined frequency among the output signal of the OR gate 23.

The LPF unit 24 is a shift register which is arranged by connecting flip-flops 241 and 242 to each other as indicated in this drawing. A clock LPFCK having a predetermined frequency is applied from a clock generator 60 to clock terminals "C" of the respective flip-flops 241 and 242. A data input terminal "D" of the flip-flop 241 which constitutes the first stage of the shift register is fixed to an H level. Then, an output signal of the flip-flop 242 which constitutes a second stage of the shift register constitutes the comparison result signal CMP. Each of the flip-flops 241 and 242 has an asynchronous reset terminal R of a low active. The output signal of the OR gate 23 is applied to the asynchronous reset terminal R of the flip-flop 241. A reset signal "RST_N" of a low active is applied to the asynchronous reset terminal R of the flip-flop 242. This reset signal RST_N is a signal which becomes active when the AGC circuit is required to be initialized, such as when the power supply is turned ON.

In accordance with the above-described arrangement, only in a case that the H level of the output signal of the OR gate 23 is maintained over a time period longer than, or equal to 1 time period of the clock LPFCK, the level of the comparison result signal CMP becomes the H level, whereas in any cases other than the above-described case, the L level of the comparison result signal CMP is maintained. The reason why such an LPF unit 24 is employed is given as follows: That is, the gains of both the electronic volumes 10L and 10R are not allowed to be changed for an instantaneous increase of either the input audio signal LIN or the input audio signal RIN, which is not so longer than 1 time period of the clock LPFCK. The frequency of the clock LPFCK is, for example, approximately 10 KHZ.

The reference level generator 30 is arranged by a resistor 31 and a switch unit 32. In this example, a high potential-sided reference level "Vrefa" from a power supply (not shown) and the reference voltage level VREF are applied to both terminals of the resistor 31. In this first embodiment, the high potential-sided reference level Vrefa is applied from an outside of the AGC circuit. In the semiconductor integrated circuit corresponding to the AGC circuit, a terminal for receiving this high potential-sided reference level Vrefa is provided. The resistor 31 includes (N−1) pieces of center taps for dividing the externally applied high potential-sided reference level Vrefa so as to generate (N−1) sorts of reference levels Vr(K) (K=1 to N−1) having a relationship of Vr(1)<Vr(2)<,- - -,<Vr(N−1). In this first embodiment, the reference level Vr(K) (K=1 to N−1) is employed as boundary values which classify the levels of the input audio signals LIN and RIN into "N" pieces of level sections, i.e., level ranges. The switch unit 32 is a circuit in which a center tap is selected from (N−1) pieces of center taps, which is designated by a reference level designation data DLVL given from the decoder 40, and a reference level of this selected center tap is supplied as a reference level Vr to the level judging circuit 20. In this first embodiment, when an audio signal LOUT outputted from the electronic volume 10L and an audio signal ROUT outputted from the electronic volume 10R are outputted to, for example, a power amplifier, an output amplitude upper limit level is applied as the high potential-sided reference level Vrefa to the reference level generator 30. The output amplitude upper limit level corresponds to an upper limit of levels of the audio signals LOUT and ROUT, by which a clip is not produced in an output signal waveform of the power amplifier. As a consequence, in some cases, the high potential-sided reference level Vrefa will be referred to as an output amplitude upper limit level Vrefa in the below-mentioned description.

The clock generator 60 is a circuit which generates base clocks BCK and BCK_N, an attack clock ATKCK, and a release clock RLSCK_N, which are employed in timing control operations of the controller 100 in addition to the generation of the above-described clock LPFCK. It should also be noted that the base clock BCK_IN corresponds to a clock obtained by inverting the level of the base clock BCK. In a preferable mode, the clock generator 60 divides the frequency of the base clock BCK so as to generate the attack clock ATKCK and the release clock RLSCK_N. Generally speaking, a relationship among the frequencies of the respective clocks is defined by BCK>ATKCK>RLSCK_N. In a preferable mode, the clock generator 60 is arranged in such a manner that a frequency dividing ratio when the frequency of the base clock BCK is divided so as to generate the attack clock ATKCK and the release clock RLSCK_N may be arbitrarily set.

The controller 100 is a circuit which controls to change predicted level data LVLm and gain setting level data LVLs based on the comparison result signal CMP outputted from the level judging unit 20. The decoder 40 is a circuit which converts the predicted level data LVLm given from the controller 100 into reference level designation data DLVL in accordance with a predetermined conversion rule, and then, supplies the reference level designation data DLVL to the reference level generator 30. The decoder 50 is a circuit which converts the gain setting level data LVLs applied from the controller 100 into the gain designation data DGAIN in accordance with a predetermined conversion rule, and supplies the gain designation data DGAIN to the electronic volumes 10L and 10R. A detailed description will now be made of contents of the control operations which are performed in the controller 100, and decoders 40 and 50.

First, the predicted level data LVLm corresponds to data indicative of a level section to which a larger level Vp of levels of current input audio signals LIN and RIN belongs. The controller 100 performs an increasing/decreasing operation in order that the level section indicated by this predicted level data LVLm is approximated to the level section to which the larger level of the current input audio signals LIN and RIN based on the comparison result signal CMP.

FIG. 2 is a diagram for explaining the increasing/decreasing operation for the predicted level data LVLm performed by the controller 100, and contents of the predicted level data LVLm. The predicted level data LVLm corresponds to (N−1) bit data. As to the predicted level data LVLm in a case that a level Vp of an input audio signal is predicted to be lower than, or equal to a reference level Vr(1), as shown in FIG. 2, all bits thereof become "0." Further, as to the predicted level data LVLm in a case that a level Vp of an input audio signal is predicted to exceed at least a reference level Vr(1), an LSB (least significant bit) thereof becomes "1", and other bits become "0". Further, as to the predicted level data LVLm in a case that a level Vp of an input audio signal is predicted to exceed at least a reference level Vr(2), 2 bits starting from the LSB thereof becomes "1", and other bits become "0". Similarly, as to the predicted level data LVLm in a case that a level Vp of an input audio signal is predicted to exceed at least a reference level Vr(K), "K" pieces of continued bits starting from the LSB(least significant bit) thereof becomes "1", and other bits become "0".

In the case that the level of the comparison result signal CMP is an "H" level at a timing when the level of the base clock BCK becomes an active level ("H" level), the controller 100 performs such an operation that a total number of the bits "1" in the predicted level data LVLm is increased by 1. In the case that the level of the comparison result signal CMP is an "L" level at a timing when the level of the base clock BCK_N becomes an active level ("L" level) after the level of the release clock RLSCK_N becomes the active level ("L" level), the controller 100 performs such an operation that a total number of the bits "1" in the predicted level data LVLm is decreased by 1.

FIG. 3 is a diagram for representing a conversion rule in the case where the decoder 40 converts the predicted level data LVLm to the reference level designation data DLVL. As shown in FIG. 3, except that all bits of the predication level data LVLm are "0" or are "1", in the case where a predicted level data LVLm is given which indicates that a level Vp of an input audio signal exceeds the reference level Vr(K), the decoder 40 outputs a reference level designation data DLVL which designates a reference level Vr(K+1). When all bits of the predicted level data LVLm are "0", the decoder 40 outputs a reference level designation data DLVL which designates the reference level Vr(1). When all bits of the predicted level data LVLm are "1", the decoder 40 outputs a reference level designation data DLVL which designates the reference level Vr(N−1).

As previously described, the control operation of the predicted level data LVLm is carried out by the controller 100, and the decoding operation from the predicted level data LVLm to the reference level designation data DLVL is carried out by the decoder 40. As a result, the reference level Vr supplied from the reference level generator 30 is set to a minimum reference level which exceeds the level Vp within the reference levels Vr(K) (K=1 to N−1) except that the level Vp of the input audio signal exceeds the reference level Vr(N−1).

Next, a description is made of gain control operations as to the electronic volumes 10L and 10R which are performed by the controller 100 and the decoder 50. Firstly, the controller 100 performs such a control operation that the gain setting level data LVLs follows the predicted level data LVLm. More precisely speaking, in the case where the level Vp of the input audio signal is increased, so that a total number of continuous bits "1" in the predicted level data LVLm is increased, the controller 100 increases the bit "1" in the gain setting level data LVLs one by one every time the attack clock ATKCK rises in order that the gain setting level data LVLs is approximated to the predicted level data LVLm in a stepwise manner. Further, in a case where the level Vp of the input audio signal is decreased and the level of the release clock RLSCK_N becomes the active level, so that a total number of the continuous bits "1" in the predicted level data LVLm is decreased by 1, the controller 100 decreases the bits "1" in the gain setting level data LVLs by 1 in response to a rising edge of the attack clock ATKCK in order that the gain setting level data LVLs is made coincident with the predicted level data LVLm.

Figure 5:
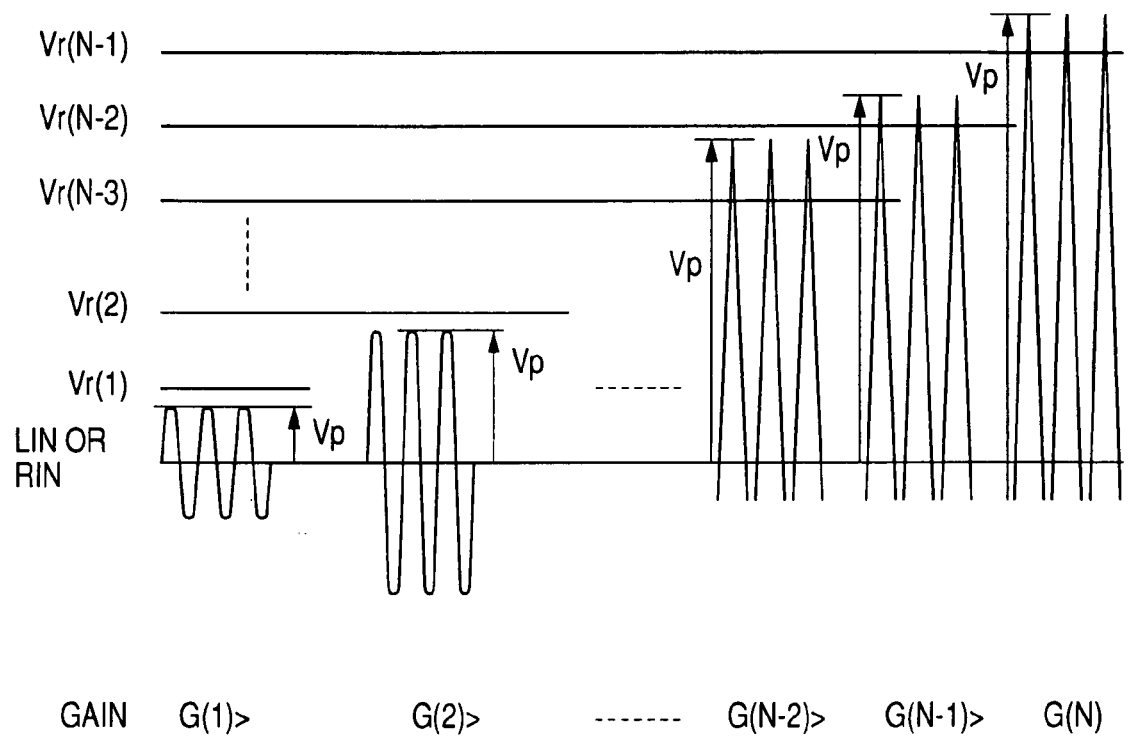
FIG. 5 is a diagram for representing a relationship between peak levels Vp of input audio signals LIN and RIN, and gains which are set to the electronic volumes 10L and 10R based on the gain designation data DGAIN when the peak levels Vp are stable in the first embodiment.

The decoder 50 converts the gain setting level data LVLs to the gain designation data DGAIN in accordance with a conversion rule shown in FIG. 4. In accordance with this gain designation data DGAIN, the gains of the electronic volumes 10L and 10R are set. FIG. 5 shows a relationship between levels Vp of the input audio signals LIN and RIN, and gains which are set to the electronic volumes 10L and 10R based on the gain designation data DGAIN in the case where the levels Lp of the input audio signals LIN and RIN are stable. As shown in this drawing, in a case that the level Vp of the input audio signal LIN, or RIN is lower than, or equal to the reference level Vr(1), the gains of the electronic volumes 10L and 10R are set to a maximum gain G(1). Every time the level Vp of the input audio signal LIN, or RIN exceeds each of the reference levels Vr(K) (K−1 to N−1), gains which are set to the electronic volumes 10L and 10R are lowered in a stepwise manner in such a manner that these gains are decreased by G(2), G(3), - - - , respectively.

Among the above-described respective apparatuses, the level judging unit 20, the reference level generator 30, the controller 100, and the decoders 40 and 50 correspond to a means for controlling the gains of the electronic volumes 10L and 10R in response to the levels of the input audio signals LIN and RIN, and may function as a gain control means. This gain control means performs a control operation for reducing the gains of the electronic volumes 10L and 10R in such a manner that the levels of both the output signals LOUT and ROUT of the electronic volumes 10L and 10R, which are determined based on the levels of the input audio signals LIN and RIN, and the gains of the electronic volumes 10L and 10R, do not exceed the previously set output amplitude upper limit level Vrefa. Due to the function of this gain control means, even when the levels of the input audio signals LIN and RIN are increased with respect to the electronic volumes 10L and 10R, the levels of the audio signals LOUT and ROUT outputted from the electronic volumes 10L and 10R to the power amplifier provided at the post stage are limited within the output amplitude upper limit level Vrefa, so that the occurrence of the clip in the power amplifier in the post stage is prevented. In order to avoid a duplication of explanations as to this featured function, this featured function will be made clear in descriptions of operations in this first embodiment.

Figure 6:
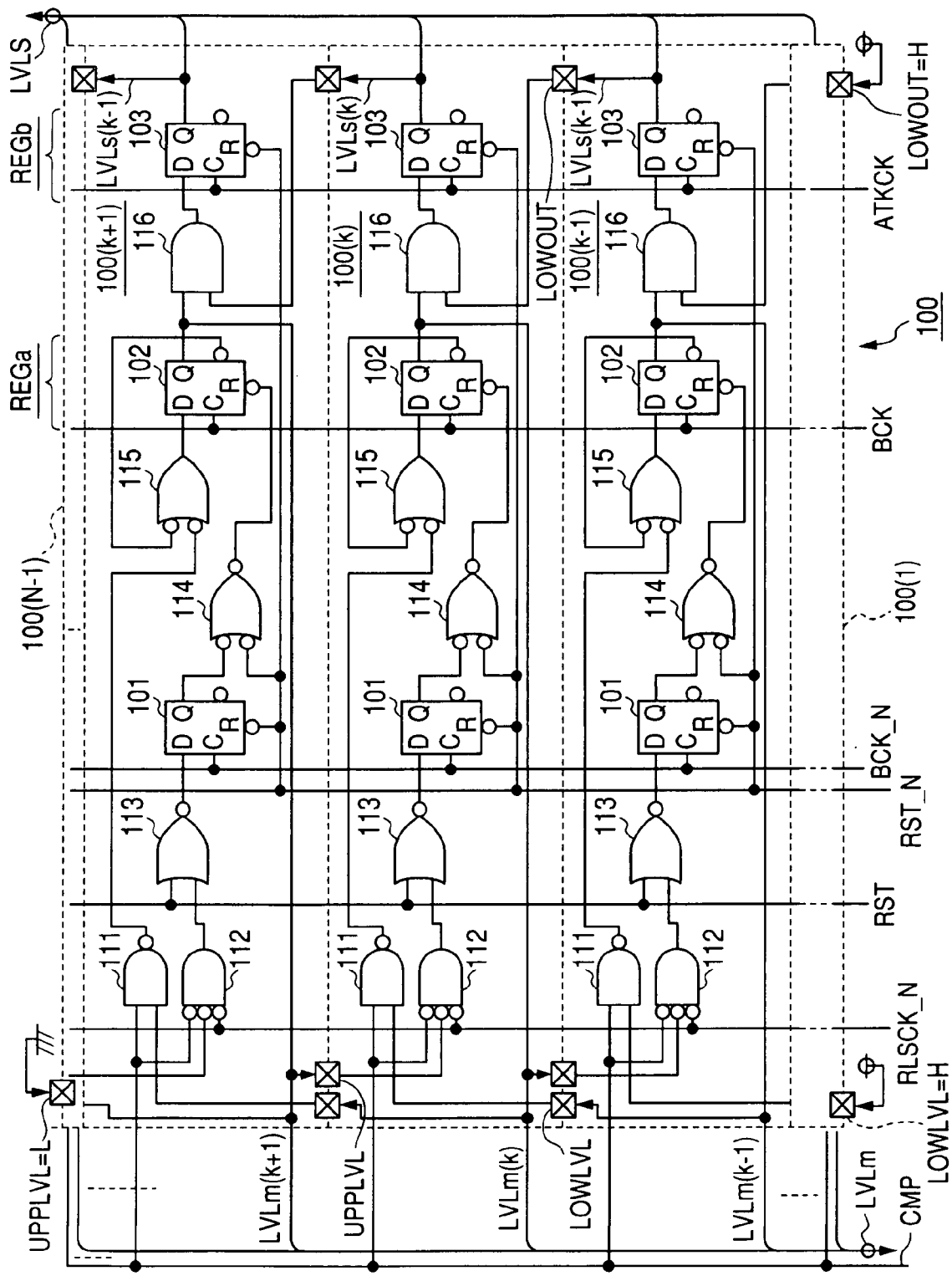
FIG. 6 is a circuit diagram for showing a concrete arrangement of the controller 100 in the first embodiment.

Next, a description is made of a concrete arrangement of the controller 100 with reference to FIG. 6. The controller 100 is arranged by connecting (N−1) pieces of control cells 100 (K) (K=1 to N−1). Each of these control cells 100(K) (K=1 to N−1) includes flip-flops 101 to 103, a NAND gate 111, a low active AND gate 112, a NOR gate 113, a low active NOR gate 114, a low active OR gate 115 and an AND gate 116.

In this controller 100, the respective flip-flops 102 of the control cells 100(K) (K=1 to N−1) constitute level registers REGa which store thereinto respective bits LVLm(K) (K=1 to N−1) of the above-described predicted level data LVLm. The respective flip-flops 103 of the control cells 100K (K=1 to N−1) constitute attack registers REGb which store thereinto respective bits LVLs(K) (K=1 to N−1) of the above-described gain setting level data LVLs.

The comparison result signal CMP is inputted to the NAND gates 111 of the respective control cells 100(K) except for K=1, and further, a bit LVLm(K−1) of the predicted level data LVLm outputted from the flip-flop 102 of the lower gate control cell 100(K−1) is inputted as data LOWLVL. Both the comparison result signal CMP and data LOWLVL having an H level are inputted to the NAND gates 111 of the control cells 100(1). Then, both an output signal of the NAND gate 111 and an output signal of a low active output terminal of the flip-flop 102 are entered to the low active OR gate 115 of each of the control cells 100(K) (K=1 to N−1). Then, in the flip-flop 102 of each of the control cells 100(K) (K=1 to N−1), the output signal of the low active OR gate 115 is inputted to a data input terminal "D" thereof; the base clock BCK is inputted to a clock terminal "C" thereof; and the output signal of the low active NOR gate 114 is inputted to a low active asynchronous reset terminal R thereof.

As a consequence, in each of the control cells 100(K) except for K=1, in a case where the level of the comparison result signal CMP is an H level, and further, the bit LVLm (K−1) of the predicted level data LVLm outputted from the flip-flop 102 of the lower-grade control cell 100(K−1) is "1", the level of the output signal of the NAND gate 111 becomes an L level, "1" is written to the flip-flop 102 in response to the rising edge of the base clock BCK, and the bit LVLm(K) of the predicted level data LVLm becomes "1." Subsequently, since "0" corresponding to the output signal of the low active output terminal of the flip-flop 102 is supplied via the low active OR gate 115 to the data input terminal D of the flip-flop 102, this output signal "0" is inverted into the signal "1", so that the bit LVLm(K) continuously maintains "1" until the non-active reset terminal R is set to the active level (L level). In the control cell 100(1), since the signal LOWLVL having the H level is applied to the NAND gate 111, when the level of the comparison result signal CMP is an H level, the level of the output signal of the NAND gate 111 becomes an L level, and the bit LVLm(1) of the predicted level data LVLm becomes "1" in response to the rising edge of the base clock BCK.

Both the comparison result signal CMP and the release clock RLSCK_N are inputted to the low active AND gate 112 of each of the control cells 100(K) except for K=N−1, and the bit LVLm(K+1) of the predicted level data LVLm outputted from the flip-flop 102 of the upper-grade control cell 100(K−1) is outputted as data UPPLVL to this low active AND gate 112. The comparison result signal CMP, the release clock RLSCK_N, and the data UPPLVL having the L level are inputted to the low active AND gate 112 of the control cell 100(N−1).

A reset signal RST and the output signal of the low active AND gate 112 are entered to the NOR gate 113 of each of the control cells 100(K) (K=1 to N−1). In this case, the reset signal is a signal which becomes an active level when an initialization of the AGC circuit is required, for example, when the power supply is turned ON.

In the flip-flop 101 of each of the control cells 100(K) (K=1 to N−1), the output signal of the NOR gate 113 is inputted to a data input terminal D; the base clock BCK_N is inputted to a clock terminal "C" thereof; and the reset signal RST_N is inputted to a low-active asynchronous reset terminal R thereof. An output terminal of a high active output terminal Q of the flip-flop 101 and the reset signal RST_N are inputted to the low active NOR gate 114 of each of the control cells 100(K) (K=1 to N−1).

As a consequence, in each of the control cells 100(K) except for K=N−1, in a case where the level of the comparison result signal CMP is an L level, and further, the bit LVLm(K+1) of the predicted level data LVLm outputted from the flip-flop 102 of the upper-grade control cell 100(K+1) is "0", and the level of the release clock RLSCLK_N is an active level ("L" level), the level of the output signal of the NAND gate 112 becomes an H level, so that "D" is written to the flip-flop 101 in response to the rising edge of the base clock BCK_N. As a consequence, the asynchronous reset terminal R of the flip-flop 102 is set to an active level ("L" level), and the bit LVLm(K) of the predicted level data LVLm becomes "0." In the control cell 100(N−1), since the signal UPPLVL having the L level is applied to the low active AND gate 112, when the level of the comparison result signal CMP is an L level and the release clock RLSCK_N is an active level ("L" level), the level of the output signal of the low active AND gate 112 becomes an H level, and the bit LVLm(K) of the predicted level data LVLm becomes "0" in response to the rising edge of the base clock BCK_N.

The output signal of the high active output terminal Q of the flip-flop 102 is inputted to the AND gate 116 of each of the control cells 100(K) except for K=N−1, and further, the bit LVLs(K−1) of the gain setting level data LVLs outputted from the flip-flop 103 of the low-grade control cell 100(K−1) is outputted as data LOWOUT to this AND gate 116. The output signal of the high active output terminal Q of the flip-flop 102, and the data LOWOUT having the H level are inputted to the AND gate 116 of the control cell 100(1).

Then, in the flip-flop 103 of each of the control cells 100(K) (K=1 to N−1), the output signal of the AND gate 116 is inputted to a data input terminal D thereof, the attack clock ATKCK is inputted to a clock terminal C thereof, and the reset signal RST_N is inputted to a low active asynchronous reset terminal "R" thereof.

As a consequence, in each of the control cells 100(K) except for K=1, in a case where the bit LVLs(K−1) of the gain setting level data LVLs outputted from the flip-flop 103 of the lower-grade control cell 100(K−1) is "1", the bit LVLm(K) of the predicted level data LVLm outputted from the flip-flop 102 is supplied via the AND gate 116 to the data input terminal D of the flip-flop 103, and is written into the flip-flop 103 in response to the rising edge of the attack clock ATKCK, and then is outputted as the bit LVLs(K) of the gain setting level data LVLs. On the other hand, in a case where the bit LVLs (K−1) of the gain setting level data LVLs outputted from the flip-flop 103 of the lower-gate control cell 100(K−1) is "0", "0" is written in the flip-flop 103, and the bit LVLs(K) is set to "0." In the control cell 100(1), the signal LOWOUT having the H level is supplied to the AND gate 116. As a consequence, the bit LVLm(1) outputted from the flip-flop 102 is written into the flip-flop 103 in response to the rising edge of the attack clock ATKCK, and then, is outputted as the bit LVLs(1) of the gain setting level data LVLs.

The above-described arrangements are the structure of the controller 100.

Next, while a concrete example is listed, operations of this first embodiment will now be described. In the AGC circuit according to the first embodiment, when levels of the input audio signals LIN and RIN are increased, an attack operation for lowering the gains of the electronic volumes 10L and 10R in a stepwise manner is carried out. In the AGC circuit according to the first embodiment, when levels of the input audio signals LIN and RIN are lowered, a release operation for increasing the gains of the electronic volumes 10L and 10R in a stepwise manner is carried out.

Figure 7:
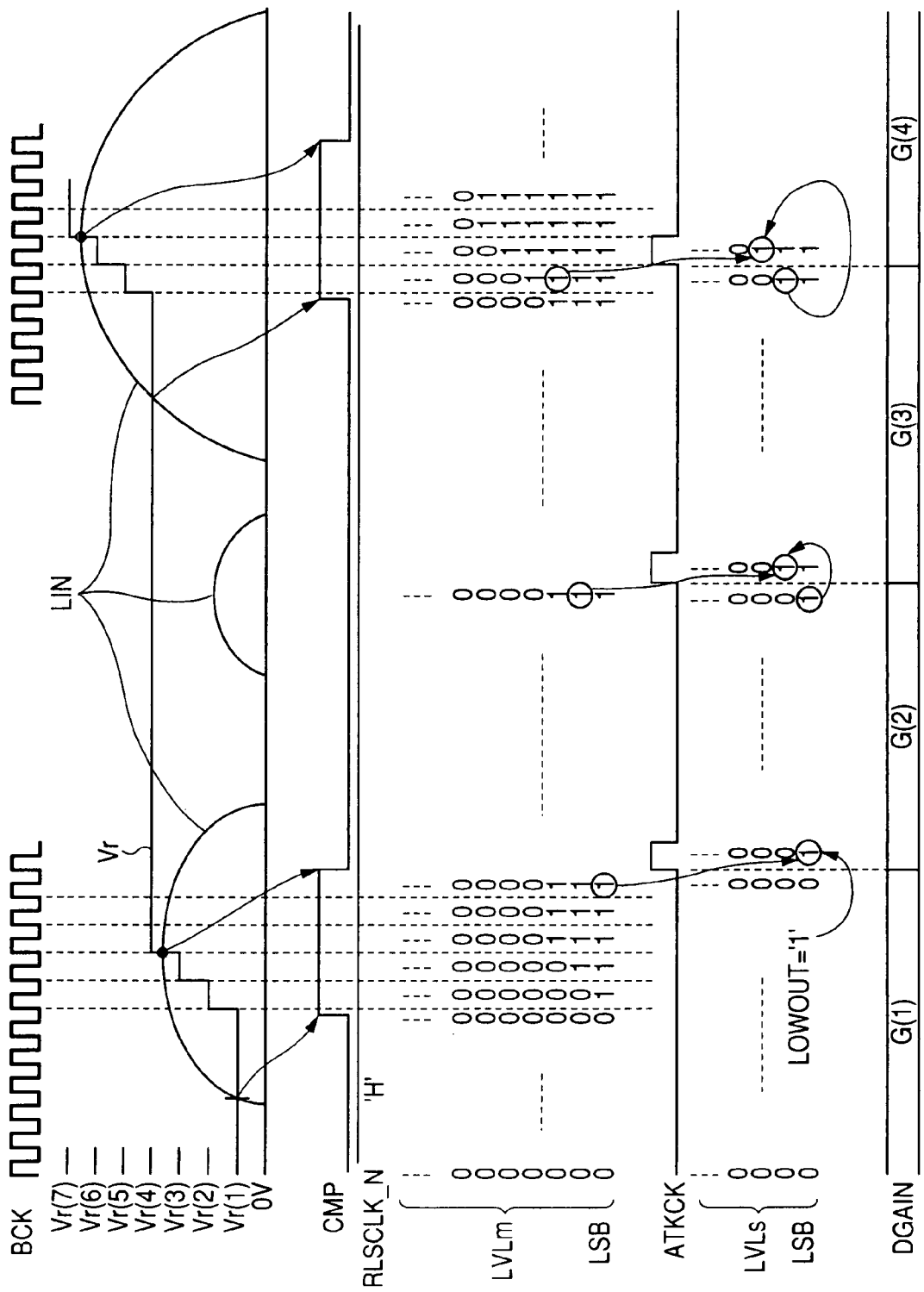
FIG. 7 is a time chart for showing an attack operation performed in the first embodiment.

FIG. 7 is a time chart for representing an example of the attack operation performed in the AGC circuit according to this first embodiment. In this example, under an initial condition, the reference level Vr is set to Vr(1) equal to the minimum level; all bits of the predicted level data LVLm are "0"; and all bits of the gain setting level data LVLs are "0." Then, an amplitude of the input audio signal LIN is larger than an amplitude of the input audio signal RIN, and this input audio signal LIN is changed in a manner as shown in this drawing.

When a first wave (leftmost-sided wave in this drawing) of the input audio signal LIN shown in FIG. 7 exceeds the reference level Vr(1), the level of the output signal of the OR gate 23 in the level judging unit 20 becomes an H level, so that the LPF unit 24 sets the level of the comparison result signal CMP to an H level in response to this H-leveled output signal. When the comparison result signal CMP becomes the H level, a first control for increasing the reference level Vr outputted from the reference level generator 30 is carried out. More precisely speaking, in the lowermost-grade control cell 100 (1), the level of the output signal of the NAND gate 111 becomes an L level, so that "1" is written into the flip-flop 102 in response to the rising edge of the base clock BCK, and thus, the bits of the predicted level data LVLm become "0, - - - ,0001." As a result, the decoder 40 supplies the reference level designation data DLVL for designating the output of the reference level Vr(2) to the reference level generator 30. As a result, the reference level Vr generated by the reference level generator 30 becomes Vr(2).

In this case, if a level of the input audio signal LIN is higher than this new reference level Vr(2), then the comparison result signal CMP maintains the H level. In this case, in the control cell 100(2), the bit LVLm(1) supplied from the control cell 100(1) is "1", and further, the comparison result signal CMP is the H level. As a result, the output signal of the NAND gate 111 becomes an "L" level, and "1" is written into the flip-flop 102 in response to the rising edge of the base clock BCK, and the predicted level data LVLm becomes "0, - - - , 0011."

Subsequently, until the reference level Vr exceeds a peak level of the input audio signal LIN and the comparison result signal CMP becomes the L level, further upper-grade bits of the predicted level data LVLm are sequentially written in response to the rising edge of the base clock BCK. In the example shown in FIG. 7, while the predicted level data LVLm is defined as "0, - - - ,0111", until the reference level Vr is set to Vr(4), the first control which increases the bit "1" in the reference level data LVLm and in creases the reference level Vr is carried out in response to the rising edge of the base clock BCK.

When the input audio signal LIN falls and becomes lower than the reference level Vr=Vr(4), the level of the comparison result signal CMP becomes an "L" level. However, while the release clock RLSCK_N maintains a non-active level, even when the comparison result signal CMP becomes an L level, in all of the control cells 100K (K=1 to N−1), the output signals of the low active AND gates 112 become "L" levels, so that "0" is not written into the flip-flops 101, and thus, the flip-flops 102 are not reset. As a result, the predicted level data LVLm maintains "0, - - - ,0111."

In the example shown in FIG. 7, although a second wave rises after the first eave of the input audio signal LIN, a peak level of this second wave does not exceeds the reference level Vr(4). As a consequence, in the AGC circuit, both the predicted level data LVLm and the reference level Vr are not updated.

Then, in the example shown in FIG. 7, after the second wave of the input audio signal LIN, although a third wave having a larger peak level than the peak level of the first wave rises, this peak level of the third wave corresponds to a level between the reference level Vr(6) and the reference level Vr(7). As a consequence, in the AGC circuit, until the predicted level data LVLm becomes 0, - - - 00111111", and the reference level Vr becomes Vr(7), the updating operations of both the predicted level data LVLm and the reference level Vr are repeatedly carried out. Although not shown in the drawing, in a case where a level of the input audio signal LIN exceeds the maximum reference level Vr(K−1), the updating operations of the predicted level data LVLm and the reference level Vr are stopped at a time instant when the reference level Vr reaches the maximum reference level Vr(K−1). In other words, the updating operations of the predicted level data LVLm and the reference level Vr are repeatedly performed while the comparison result signal CMP is in the "H" level, or until the reference level Vr reaches the maximum value Vr(K−1).

In parallel to the above-explained operations, in the AGC circuit, a third control for approximating the gain setting level data LVLs to the predicted level data LVLm in the stepwise manner is carried out in response to the attack clock ATKCK.

In the example indicated in FIG. 7, when the gain setting level data LVLs corresponds to "0, - - - ,0000", and the predicted level data LVLm corresponds to "0, - - - ,0111", the attack clock ATKCK rises. At this time, in the control cell 100(1), since a level of the signal LOWOUT with respect to the AND gate 116 is an "H" level ("1") and further the bit LVLm(1) of the predicted level data LVLm outputted from the flip-flop 102 is "1", "1" is written to the flip-flop 103. As a result, the gain setting level data LVLs becomes "0, - - - , 0001", which is approximated with respect to the predicted level data LVLm="0, - - - ,0111" only by 1 step.

Thereafter, when the gain setting level data LVLs corresponds to "0, - - - ,0001", and the predicted level data LVLm corresponds to "0, - - - ,0111", the attack clock ATKCK rises. At this time, in the control cell 100(2), since the bit LVLs(1) of the gain setting level data LVLs outputted from the flip-flop 103 of the lower-grade control cell 100(1) corresponds to "1", and the bit LVLm(2) of the predicted level data LVLm outputted from the flip-flop 102 corresponds to "1", "1" is written to the flip-flop 103. As a result, the gain setting level data LVLs becomes "0, - - - ,0011", which is approximated with respect to the predicted level data LVLm="0, - - - ,0111" only by 1 step.

Thereafter, when the gain setting level data LVLs corresponds to "0, - - - ,0011", and the predicted level data LVLm corresponds to "0, - - - ,01111", the attack clock ATKCK rises. At this time, in the control cell 100(3), since the bit LVLs(2) of the gain setting level data LVLs outputted from the flip-flop 103 of the lower-grade control cell 100(2) corresponds to "1", and the bit LVLm(3) of the predicted level data LVLm outputted from the flip-flop 102 corresponds to "1", "1" is written to the flip-flop 103. As a result, the gain setting level data LVLs becomes "0, - - - ,0111", which is approximated with respect to the predicted level data LVLm= "0, - - - , 01111" only by 1 step, As previously described, in the AGC circuit according to this first embodiment, until the reference level Vr exceeds the levels of both the input audio signals LIN and RIN, a total number of the bits "1" of the predicted level data LVLm is increased in response to the base clock BCK so as to increase the reference level Vr in the stepwise manner (first control). Furthermore, in response to the attack clock ATKCK, the gain setting level data LVLs is approximated to the predicted level data LVLm in the stepwise manner so as to lower the gains of the electronic volumes 10L and 10R in the stepwise manner (third control). In this case, if the frequency of the attack clock ATKCK is increased, then such an attack time can be shortened, namely, such a time required to lower the gains of the electronic volumes 10L and 10R up to optimum gains related to the levels of the input audio signals LIN and RIN. Conversely, if the frequency of the attack clock ATKCK is decreased, then the attack time can be prolonged. As a consequence, in accordance with this first embodiment, the frequency of the attack clock ATKCK is selected to be the proper value, so that the desirable attack time can be realized.

Figure 8:
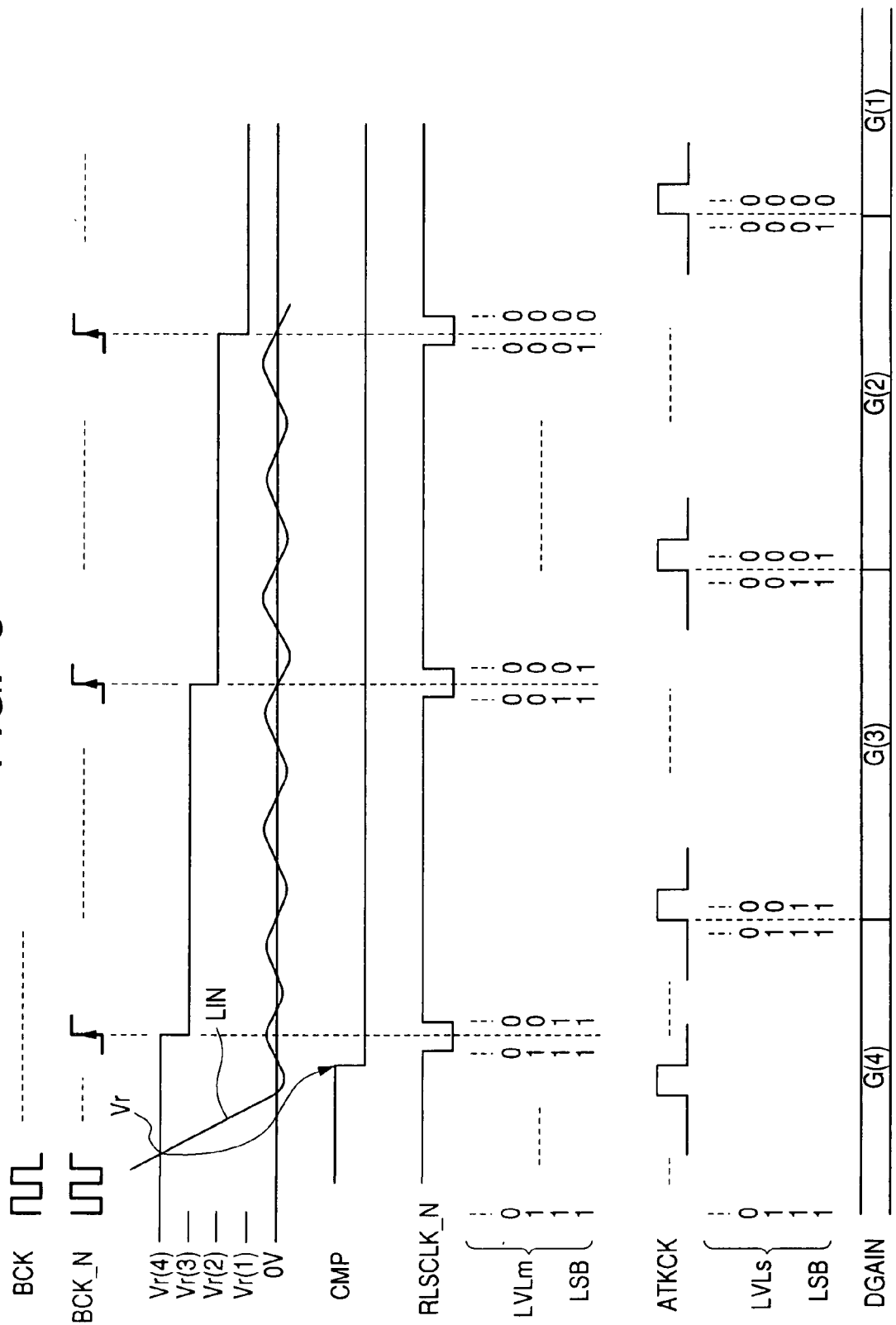
FIG. 8 is a time chart for showing a release operation performed in the first embodiment.

FIG. 8 is a time chart for representing an example as to a release operation executed in the AGC circuit according to this first embodiment. In this example, an amplitude of the input audio signal LIN is larger than an amplitude of the input audio signal RIN, and as represented in this drawing, this input audio signal LIN falls, and a peak level thereof is lower than the reference voltage Vr(1). The predicted level data LVLm becomes "0, - - - ,0111", and the gain setting level data LVLs becomes "0, - - - ,0111."

In the example shown in this drawing, after the input audio signal LIN becomes lower than the reference level Vr=Vr(4), and a level of the comparison result signal CMP becomes an "L" level, the release clock RLSCK_N becomes an active level ("L" level). As a result, in the controller 100, a second control for lowering the reference level Vr outputted from the reference level generator 30 is carried out. More precisely speaking, when the level of the release clock RLSCK_N becomes the active level ("L" level), in the control cell 100(3), the bit LVLm(4) of the predicted level data LVLm outputted from the flip-flop 102 of the upper-grade control cell 100(4) corresponds to "0", so that a level of the output signal of the low active AND gate 112 becomes an "H" level. As a consequence, "0" is written into the flip-flop 101 in response to the rising edge of the base clock BCK_N. As a result, the asynchronous reset terminal R of the flip-flop 102 is set to an active level ("L" level), and thus, the bit LVLm(3) of the predicted level data LVLm becomes "0." In the control cells 100(2) and 100(1), when the base clock BCK_N rises, the bit LVLm(3) and the bit LVLm(2) supplied from the upper-grade control cells 100(3) and 100(2) respectively become "1", so that "0" is not written into the flip-flop 101, but also the flip-flop 102 is not reset. As a consequence, the predicted level data LVLm is changed from "0, - - - ,0111" to "0, - - - ,0011" in response to the rising edge of the base clock BCK_N, and the reference level Vr outputted from the reference level generator 30 is lowered from Vr(4) to Vr(3).

Then, after the release clock RLSCK_N falls, if the first attack clock ATKCK rises, then a fourth control is carried out in the controller 100. More precisely speaking, in the control cell 100(3), since the bit LVLm(3) corresponding to the output signal of the flip-flop 102 is changed to "0", "0" is written to the flip-flop 103, so that the bit LVLs(3) becomes "0." As a result, the gain setting level data LVLs is changed from "0, - - - ,0111" into "0, - - - ,0011", and the gains of the electronic volumes 10L and 10R are increased from G(4) to G(3).

Subsequently, either while the level of the comparison result signal CMP is the "I" level or until the reference level Vr reaches to the minimum value Vr(1), every time the release clock RLSCK_N becomes the active level, updating operations similar to the above-described updating operations are carried out with respect to the predicted level data LVLm and the gain setting level data LVLs; the reference level Vr is lowered in the stepwise manner; and the gains of the electronic volumes 10L and 10R are increased in the stepwise manner. In this case, if the frequency of the release clock RLSCK_N is increased, then such a release time can be shortened, namely, such a time required to increase the gains of the electronic volumes 10L and 10R up to optimum gains related to the levels of the input audio signals LIN and RIN. Conversely, if the frequency of the release clock RLSCK_N is decreased, then the release time can be prolonged. As a consequence, in accordance with this first embodiment, the frequency of the release clock RLSCK_N is selected to be the proper value, so that the desirable release time can be realized.

In accordance with the above-explained attack operation and release operation, the gain setting level data LVLs is changed in such a manner that this level data LVLs represents a level higher than at least the peak levels of the signal waveforms of the input audio signals LIN and RIN, and the gains of the electronic volumes 10L and 10R are automatically adjusted to become such magnitudes in response to this gain setting level data LVLs. In this case, in the first embodiment, even when the levels of the input audio signals LIN and RIN are increased with respect to the electronic volumes 10L and 10R, the gains G(K) (K=1 to N) with respect to the level sections of the input audio signals LIN and RIN indicated by the gain setting level data LVLs are determined in such a manner that the levels of the audio signals LOUT and ROUT outputted from the electronic volumes 10L and 10R with respect to the power amplifier provided at the post stage are limited within the output amplitude upper limit level Vrefa. As a consequence, it is possible to avoid that the clip is generated in the power amplifier provided in the post stage. In the below-mentioned description, a description is made of a method for determining the gains G(K) (K=1 to N) in response to sections of levels of the input audio signals LIN and RIN in this first embodiment, while a complete example is exemplified.

Figure 9:
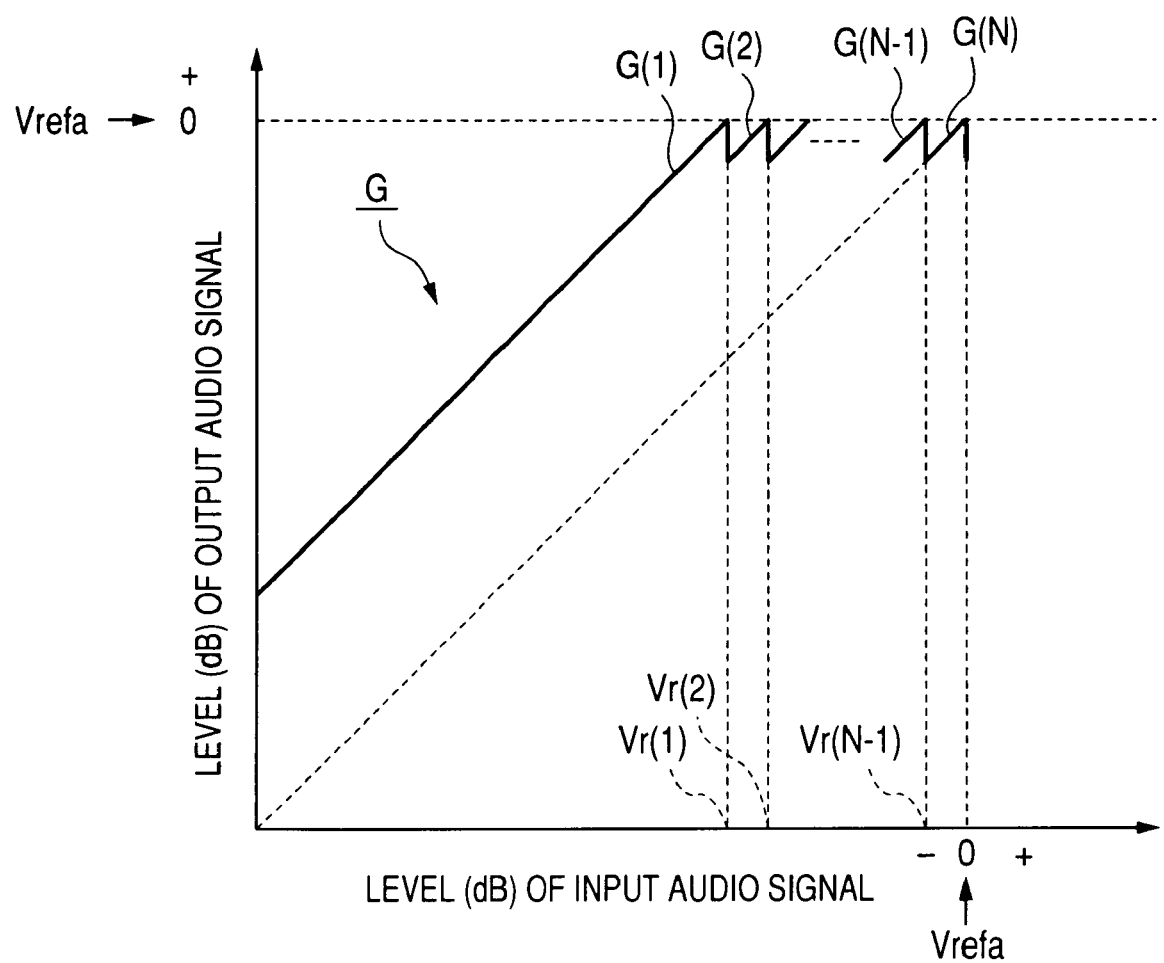
FIG. 9 is a diagram for showing a first example as to a relationship between a level of an input audio signal and a level of an output audio signal, and another relationship between the level of the input audio signal and gains set to the electronic volume 10L and 10R under such a condition that the gains of the electronic volumes 10L and 10R are controlled by the controller 100 in the first embodiment.

FIG. 9 is a graphic diagram for showing a first example as to a relationship between a level of an input audio signal and a level of either a output audio signal LOUT or another output audio signal ROUT corresponding to the input audio signal, and another relationship between the level of the input audio signal and gains set to the electronic volumes 10L and 10R under such a condition that gain control operations with respect to the electronic volumes 10L and 10R are carried out by the controller 100 in this first embodiment. Precisely speaking, the above-described level of the input audio signal implies a higher level of either the input audio signal LIN or the input audio signal RIN, and will be simply referred to as a "level of input audio signal" hereinafter. Further, the above-described level of the output audio signal LOUT, or ROUT will be simply referred to as a "level of output audio signal" hereinafter. In this drawing, an abscissa indicates the level of the input audio signal in the unit of dB value, whereas an ordinate shows the level of the output audio signal in the unit of dB value. In the abscissa and the ordinate, levels of the output amplitude upper limit level Vrefa become 0 dB.

In this example, positions of the center taps corresponding to the respective gains G(K) in the resistors 11 of the electronic volumes 10L and 10R are determined in such a manner that the magnitudes of the gains G(K) (K=1 to N) become Vrefa/Vr(K).

In the case where a level of an input audio signal is lower than, or equal to the reference level Vr(1), the input audio signal is amplified in the maximum gain G(1) in the electronic volumes 10L and 10R. As a result, in this case, the input audio signal can be amplified without deteriorating strong/weak contrast owned by the input audio signal, and then, the amplified input audio signal can be supplied to the power amplifier provided at the post stage.

Then, when the level of the input signal reaches the reference level (1), the level of the output audio signal becomes {Vrefa/Vr(1)}×Vr(1)=Vrefa, which reaches the output amplitude upper limit level Vrefa. However, when the level of the input signal exceeds the reference level Vr(1), since the gains G to be set to the electronic volumes 10L and 10R are selected to be a lower gain G(2) than the gain G(1), the level of the output audio signal becomes lower than the output amplitude upper limit level Vrefa. As a result, an occurrence of a clip in the power amplifier at the post stage can be avoided.

Then, when the level of the input signal reaches the reference level (2), the level of the output audio signal becomes (Vrefa/Vr(2)}×Vr(2)=Vrefa, which reaches the output amplitude upper limit level Vrefa. However, when the level of the input signal exceeds the reference level Vr(2), since the gains G to be set to the electronic volumes 10L and 10R are selected to be a lower gain G(3) than the gain G(2), the level of the output audio signal becomes lower than the output amplitude upper limit level Vrefa. As a result, an occurrence of a clip in the power amplifier at the post stage can be avoided.

A similar operation to the above-described operation is performed. That is, when a level of an input audio signal is increased, if a level of an output audio signal exceeds the output amplitude upper limit level Vrefa, then gains G to be set to the electronic volumes 10L and 10R are switched to gains lower than the first-mentioned gains.

As previously explained, when the level of the input audio signal is lower than, or equal to the reference level Vr(1), and further, the level of the output audio signal is converged with the output amplitude limit level Vrefa, the input audio signal is amplified in the maximum gain G(1). In a case that the level of the input audio signal exceeds the reference level Vr(1), the level of the output audio signal which is supplied to the power amplifier of the post stage from the electronic volumes 10L and 10R is limited within the output amplitude upper limit level Vrefa, so that the occurrence of the clip in the power amplifier at the post stage is avoided.

Figure 10:
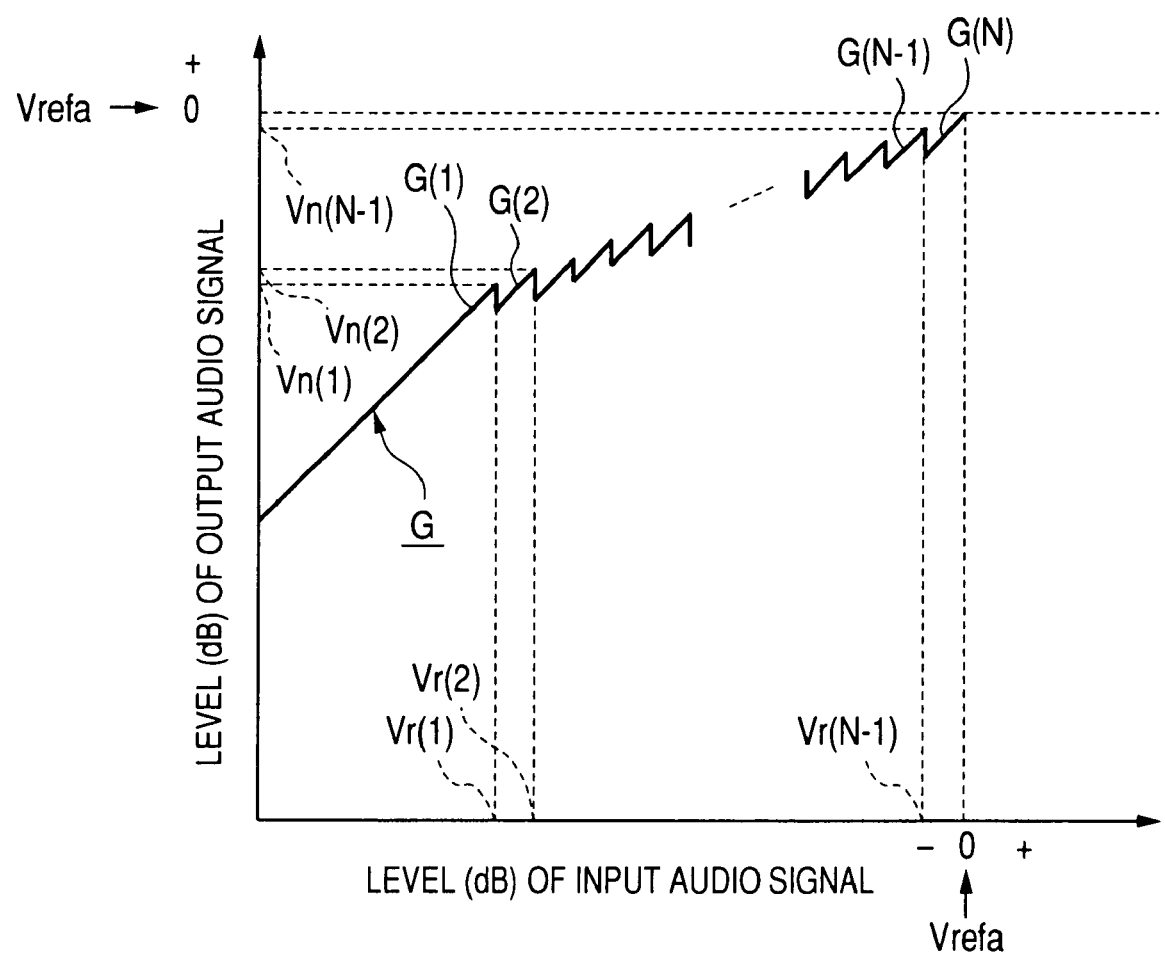
FIG. 10 is a diagram for showing a second example as to a relationship between a level of an input audio signal and a level of an output audio signal, and another relationship between the level of the input audio signal and gains set to the electronic volume 10L and 10R under such a condition that the gains of the electronic volumes 10L and 10R are controlled by the controller 100 in the first embodiment.

FIG. 10 is a graphic diagram for showing a second example as to a relationship between a level of an input audio signal and a level of an output audio signal, and another relationship between the level of the input audio signal and gains which are set to the electronic volumes 10L and 10R. In this second example, the gains of the electronic volumes 10L and 10R are controlled in such a manner that when a level of an input audio signal is higher than the reference level Vr(1), a gradient of a level of an output audio signal with respect to the level of the input audio signal becomes smaller than a gradient obtained in a section where the level of the input audio signal is lower than, or equal to the reference level Vr(1).

In order to establish a relationship between the level of the input audio signal and the level of the output audio signal as illustrated in the drawing, in this second embodiment, levels Vu(K) (K=1 to N−1) are previously determined in such a manner that Vu(1)<Vu(2)<, - - - ,Vu(N−1)=Vrefa, and further, positions of the center taps corresponding to the respective gains G(K) (K=1 to N) in the resistors 11 of the electronic volumes 10L and 10R in such a manner that the magnitudes of the respective gains G(K) become Vu(K)/Vr(K).

In this second example, within a section that the level of the input audio signal exceeds the reference voltage Vr(1), a dynamic range compression is carried out, and the level of the output audio signal supplied to the power amplifier provided at the post stage is limited within the output amplitude upper limit level Vrefa, so that it is possible to avoid an occurrence of a clip in the power amplifier of the post stage. In the second example shown in this drawing, the values of the reference levels Vr(K) (K=2 to N−1) are determined in such a manner that a level width between the reference level Vr(1) and Vrefa on the logarithmic axis is subdivided in an equi-interval. The values of the levels Vu(K) (K=2 to N−1) are determined in such a manner that a level width between the level Vu(1) and Vrefa on the logarithmic axis is subdivided in an equi-interval. As a result, within a section that the level of the input audio signal is higher than the reference level Vr(1), the dB value of the level of the output audio signal with respect to the increase in the dB value of the level of the input audio signal is changed in a substantially linear manner. However, since setting of the reference levels Vr(K) (K=2 to N−1) and setting of the levels Vu(K) (K=2 to N−1) are changed, it is possible to arbitrarily determine the relationship between the dB value of the level of the input audio signal and the dB value of the level of the output audio signal within a section that the level of the input audio signal is higher than the reference level Vr(1).

As previously described, in accordance with this first embodiment, since not such a non-linear element as VCA is employed, but the electronic volumes 10L and 10R are employed as the means for controlling the gain, the gain can be controlled without distorting the output signal of the power amplifier with respect to the input audio signal. In a case that the level of the input audio signal is lower than, or equal to the predetermined reference level (namely, reference level Vr(1) in first example; approximately reference level Vr(N−1) in second example), and furthermore, the level of the output audio signal is present within the output amplitude upper limit level Vrefa, the input audio signal is amplified by employing the electronic volumes 10L and 10R in a relatively high gain. Then, in a case that the level of the output audio signal exceeds the output amplitude upper limit level Vrefa, the gains which are to be set to the electronic volumes 10L and 10R are switched to lower gains, so that the level of the output audio signal is limited within the output amplitude upper limit level Vrefa. As previously explained, in accordance with this first embodiment, when there is such a risk that the clip may be produced, the gains are reduced so as to be able to avoid that the clip occurs in the power amplifier. Moreover, in accordance with this first embodiment, since the corresponding relationship between the gains and the level sections of the input audio signals is properly determined, not only the above-described clip preventing effect, but also other effects may be achieved. For instance, a gain corresponding to a level section equivalent to a large sound volume area is lowered. As a result, while a dynamic range may be suppressed, the unpleasant large sound volume may be reduced (for example, a section that level of input audio signal is higher than reference level Vr(1) in FIG. 10). Alternatively, a gain corresponding to a level section equivalent to a small sound volume may be increased in order that small sound may be amplified in an easy listening sound volume (for example, a section that level of input audio signal is lower than, or equal to reference level Vr(1) in FIG. 10). Further, in accordance with this first embodiment, the output amplitude upper limit level Vrefa may be applied from an external source to the ACTC circuit. As a consequence, even when various sorts of power amplifiers are connected to the post stage of the AGC circuit, since the magnitude of the output amplifier upper limit level Vrefa is made coincident with an upper limit of an input level allowable range by which a clip is not produced in a power amplifier connected to the post stage, it is possible to prevent an occurrence of a clip in this power amplifier.

Figure 11:
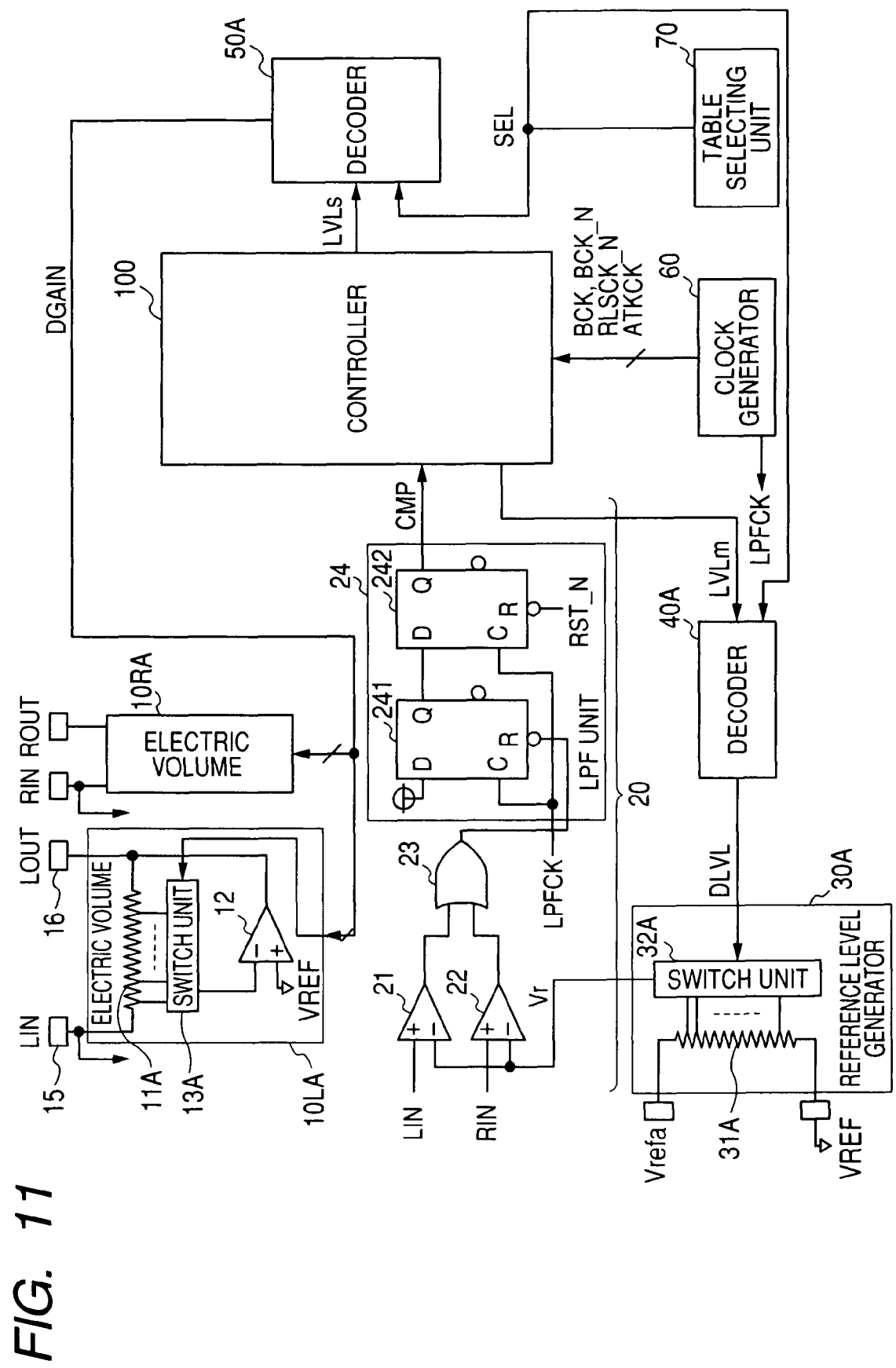
FIG. 11 is a block diagram for indicating an arrangement of an AGC circuit according to a second embodiment of the present invention.

FIG. 11 is a block diagram for showing an arrangement of an AGC circuit according to a second embodiment of the present invention. The AGC circuit of this second embodiment is realized by improving the above-described AGC circuit of the first embodiment, which is capable of switching both (N−1) sorts of reference levels Vr(K) (K=1 to N−1) for defining "N" sorts of level sections, and (N) sorts of gains G(K) (K=1 to N) corresponding to the "N" sorts of level sections in accordance with externally supplied control information.

In FIG. 11, a resistor 31A provided in a reference level generator 30A includes center taps which are larger than (N−1), while a switch 32 selects a center tap from these center taps, which is designated by reference level designation data DLVL supplied from a decoder 40A, and outputs a voltage of this selected center tap as a reference level Vr. Further, a resistor 11A employed in an electronic volume 10LA, or 10RA includes center taps which are larger than (N) pieces, while a switch unit 13A selects a center tap designated from gain designation data DGAIN supplied from a decoder 50A among these center taps, and then, connects the selected center tap to a non-inverting input terminal of an operational amplifier 12.

The decoder 40A stores thereinto a plurality of conversion tables which causes predicted level data LVLm outputted from a controller 100 to be related to reference level designation data DLVL. Among these conversion tables, a certain conversion table causes each of the predicted level data LVLm for designating each of the reference levels Vr(K) (K=1 to N−1) to be related to a reference level designation data DLVL for designating a center tap position of the resistor 31A corresponding to each of the reference levels Vr(K) shown in FIG. 9. Further, another conversion table causes each of the predicted level data LVLm for designating each of the reference levels Vr(K) (K=1 to N−1) to be related to a reference level designation data DLVL for designating a center tap position of the resistor 31A corresponding to each of the reference levels Vr(K) shown in FIG. 10. Similarly, the decoder 50A stores thereinto plural sorts of conversion tables which cause gain setting level data LVLs outputted from the controller 100 to be related to gain designation data DGAIN. Among these conversion tables, a certain conversion table causes each of the gain setting level data LVLs for designating each of the gains G(K) (K=1 to N) to be related to a gain designation data DGAIN which designates a center tap position of the resistor 11A corresponding to each of the gains G(K) (K=1 to N) shown in FIG. 9. Further, another certain conversion table causes each of the gain setting level data LVLs for designating each of the gains G(K) (K=1 to N) to be related to a gain designation data DGAIN which designates a center tap position of the resistor 11A corresponding to each of the gains G(K) (K=1 to N) shown in FIG. 10.

A table selecting unit 70 outputs table selection information SEL to the decoders 40A and 50A in accordance with control information applied from an external source, while this table selection information SEL designates a conversion table employed in a conversion from predicted level data LVLm to reference level designation data DLVL, and designates a conversion table employed in a conversion from gain setting level data LVLs to gain designation data DGAIN. Both the decoder 40A and the decoder 50A performs the conversion from the predicted level data LVLm to the reference level designation data DLVL, or the conversion from the gain setting level data LVLs to the gain designation data DGAIN.

Similarly, in this second embodiment, a similar effect to that of the above-described first embodiment can be achieved. In accordance with the second embodiment, in response to the externally-supplied control information, the AGC operation as represented in, for example, FIG. 9 is caused to be performed by the AGC circuit, or the AGC operation as shown in FIG. 10 is caused to be performed by the AGC circuit, namely, the AGC operation to be executed by the AGC circuit may be selected.

While one embodiment of the present invention has been described, other embodiments according to the present invention may be readily conceived. For instance, in the respective embodiments, while monitoring the comparison results between the input audio signals LIN and RIN, and the reference level Vr, the reference level Vr outputted by the reference level generator 30 is changed so as to acquire the level section of the input audio signal, and then, the gain corresponding to the acquired level section is set to the electronic volumes 10L and 10R. However, instead of the employment of such a means, alternatively, an input audio signal may be A/D-converted; a peak level of the input audio signal may be obtained based on a digital sample stream produced from this AID converting operation; and thus, the gains of the electronic volumes 10L and 10R may be alternatively controlled based on the peak level.

The embodiments according to the present invention have been described above. However, the invention is not limited thereto, and other embodiments can be conceived.

(1) The clock generator 60 may receives control information indicative of the attack time and the release time from the exterior of the AGC circuit, and determine the frequencies of the attack clock ATKCK and the release clock RLSCK_N based on the control information.

(2) The clock generator 60 may not be provided inside the AGC circuit and the audio appliance implementing the AGC circuit may supply the clock BCK, BCK_N, ATKCK, RLSCK_N, LPFCK to the AGC circuit. In this case, the frequencies of the clock ATKCK and RLSCK_N to be supplied to the AGC circuit from the audio appliance may be determined so as to obtain the attack time and the release time suitable for the audio appliance. The frequencies of the clocks ATKCK and RLSCK_N may be determined by manipulating a manipulating device provided to the audio appliance.

(3) In the above embodiment, the base clock BCK triggers the first control for increasing the reference level, the release clock RLSCK_N (accurately, release clock RLSCK_N and base clock BCK_N) triggers the second control for lowering the reference level, and the attack clock ATKCK triggers the third and fourth controls for approximating the gains of the electronic volume 10L and 10R to the variation of the reference level. However, this embodiment may be modified, and each control may be activated in the following manner. That is, the base clock BCK may trigger the first and second controls, the release clock RLSCLK_N may trigger the third control and the RLSCLK_N may trigger the fourth control. In this manner, by adjusting the frequencies of the attack clock ATKCK and the release clock RLSCK_N the desired attack time and the release time can be obtained.

What is claimed is:

1. An automatic gain control circuit comprising:
an electronic volume that amplifies an input audio signal in a variable gain and outputs the amplified input audio signal;
a reference level generator that outputs a reference level;
a level judging unit that compares a level of the input audio signal with the reference level outputted by the reference level generator and outputs a comparison result signal for indicating whether or not the level of the input audio signal is higher than the reference level; and
a controller which increases or decreases predicted level data indicative of a level range to which the level of the input audio signal is predicted to belong, among a plurality of level ranges of the input audio signal, based on the comparison result signal, controls the reference level generator to output a value of the reference level corresponding to the level range indicated by the predicted level data, and controls a gain of the electronic volume in response to the predicted level data,
wherein the gain of the electronic volume is controlled so that a level of a signal output from the electronic volume, which is determined based on a level of the input audio signal and the gain of the electronic volume, does not exceed an amplitude upper limit level.

2. An automatic gain control circuit comprising:
an electronic volume that amplifies an input audio signal in a variable gain and outputs the amplified input audio signal;
a reference level generator that outputs a reference level;
a level judging unit that compares a level of the input audio signal with the reference level outputted by the reference level generator and outputs a comparison result signal for indicating whether or not the level of the input audio signal is higher than the reference level; and
a controller updates predicted level data indicative of a level section, to which the level of the input audio signal belongs, among a plurality of level sections of the input audio signal based on the comparison result signal, controls the reference level outputted by the reference level generator based on the predicted level data, and controls the gain of the electronic volume based on the predicted level data so that the gain of the electronic volume becomes a gain which is previously related to the level section to which the level of the input audio signal belongs,
wherein the level section and the gain of the input audio signal are related to each other in such a manner that a level of the output signal of the electronic volume does not exceed a previously set output amplitude upper limit level.

3. The automatic gain control circuit according to claim 2, wherein the level section and the gain of the input audio signal are related to each other in such a manner that the gain in a small sound volume area is increased and the gain in a large sound volume area is decreased.

4. The automatic gain control circuit according to claim 2, wherein
the reference level generator divides the output amplitude upper limit level to generate a plurality of the reference levels which correspond to boundary levels of the plurality of level sections, and outputs one of the plurality of reference levels selected by the controller,
the controller selects the one of the plurality of reference levels to be outputted by the reference level generator based on the predicted level data, and
the electronic volume amplifies the input audio signal in the gain selected from the plurality of gains by the controller.

5. The automatic gain control circuit according to claim 4 further comprising a switching unit that switch the plurality of reference levels and the plurality of gains related to the plurality of the level sections according to control information given from an external source.

6. An automatic gain control circuit comprising:
an electronic volume that amplifies an input audio signal in a variable gain and outputs the amplified input audio signal;
a reference level generator that outputs a reference level;
a level judging unit that compares the input audio signal with the reference level outputted by the reference level generator, and outputs a comparison result signal for indicating whether or not a level of a peak of a waveform of the input audio signal is higher than the reference level;
a controller that performs a first, second, third and fourth controls according to predetermined respective clocks,
wherein the first control increases the reference level outputted by the reference level generator when the comparison result signal indicates that the level of the peak of the waveform of the input audio signal is higher than the reference level, wherein the second control lowers the reference level outputted by the reference level generator when the comparison result signal indicates that the level of the peak of the waveform of the input audio signal is not higher than the reference level, wherein the third control lowers the gain of the electronic volume so as to approximate the increase of the reference level so that the gain of the electronic volume becomes a proper gain related to the reference level, and wherein the fourth control increases the gain of the electronic volume so as to follow the decrease of the reference level so that the gain of the electronic volume becomes a gain related to the reference level.

7. The automatic gain control circuit according to claim 6, wherein the controller performs the first control when a level of a base clock having a predetermined frequency becomes an active level, performs the second control when levels of the base clock and a release clock become the active level, and performs the third and fourth controls when a level of an attack clock having a predetermined frequency becomes an active level.

8. The automatic gain control circuit according to claim 7, wherein
the base clock, the release clock and the attack clock are generated by a clock generator, and
the clock generator is capable of setting the frequencies of at least the release clock and the attack clock according to control information given from an external source.

9. The automatic gain control circuit according to claim 7, wherein the controller receives the base clock, the release clock and the attack clock from an external source.

10. The automatic gain control circuit according to claim 6, wherein the electronic volume includes:
a resistor interposed between an audio signal input terminal to which the input audio signal is applied and an audio signal output terminal for outputting the amplified audio signal;
an operational amplifier including a non-inverting input terminal whose level is fixed and an output terminal connected to the audio signal output terminal; and
a switch portion that receives informing indicative of a gain, selects a center tap from a plurality of center taps connected to the resistor according to the received information, and connects the selected center tap to the non-inverting terminal of the operation amplifier.

* * * * *